United States Patent
Wi et al.

(10) Patent No.: US 11,557,705 B2
(45) Date of Patent: Jan. 17, 2023

(54) METHOD FOR MANUFACTURING DISPLAY DEVICE USING SEMICONDUCTOR LIGHT-EMITTING ELEMENTS AND DISPLAY DEVICE

(71) Applicant: LG ELECTRONICS INC., Seoul (KR)

(72) Inventors: Kyoungtae Wi, Seoul (KR); Sunghyun Moon, Seoul (KR); Jina Jeon, Seoul (KR)

(73) Assignee: LG ELECTRONICS INC., Seoul (KR)

(*) Notice: Subject to any disclaimer, the term of this patent is extended or adjusted under 35 U.S.C. 154(b) by 326 days.

(21) Appl. No.: 16/965,235

(22) PCT Filed: Jan. 29, 2018

(86) PCT No.: PCT/KR2018/001206
§ 371 (c)(1),
(2) Date: Jul. 27, 2020

(87) PCT Pub. No.: WO2019/146819
PCT Pub. Date: Aug. 1, 2019

(65) Prior Publication Data
US 2020/0373473 A1    Nov. 26, 2020

(51) Int. Cl.
*H01L 33/62* (2010.01)
*H01L 27/15* (2006.01)
(Continued)

(52) U.S. Cl.
CPC .......... *H01L 33/62* (2013.01); *H01L 27/156* (2013.01); *H01L 33/0095* (2013.01); *H01L 33/56* (2013.01); *H01L 2933/0066* (2013.01)

(58) Field of Classification Search
CPC ... H01L 33/62; H01L 27/156; H01L 33/0095; H01L 33/56; H01L 2933/0066;
(Continued)

(56) References Cited

U.S. PATENT DOCUMENTS

2013/0273695 A1    10/2013 Menard et al.
2014/0159066 A1    6/2014 Hu et al.
(Continued)

FOREIGN PATENT DOCUMENTS

KR    10-2008-0070759 A    7/2008
KR    10-1620469 B1    5/2016
(Continued)

*Primary Examiner* — Victor A Mandala
(74) *Attorney, Agent, or Firm* — Birch, Stewart, Kolasch & Birch, LLP

(57) ABSTRACT

The present invention relates to a method for manufacturing a display device using semiconductor light-emitting elements and a display device. The method for manufacturing a display device according to the present invention comprises the steps of: transferring semiconductor light-emitting elements provided on a growth substrate to an adhesive layer of a temporary substrate; curing the adhesive layer of the temporary substrate; aligning the temporary substrate with a wiring substrate having a wiring electrode and a conductive adhesive layer; compressing the temporary substrate to the wiring substrate so that the semiconductor light-emitting elements bond to the wiring substrate together with the adhesive layer of the temporary substrate, and then removing the temporary substrate; and removing at least a part of the adhesive layer to expose the semiconductor light-emitting elements to the outside, and depositing electrodes on the semiconductor light-emitting elements.

20 Claims, 14 Drawing Sheets

(51) Int. Cl.
*H01L 33/00* (2010.01)
*H01L 33/56* (2010.01)

(58) Field of Classification Search
CPC ........... H01L 33/44; H01L 2221/68318; H01L 2221/68381; H01L 21/6835; H01L 25/0753; H01L 33/36
See application file for complete search history.

(56) References Cited

U.S. PATENT DOCUMENTS

| | | | |
|---|---|---|---|
| 2016/0181476 A1* | 6/2016 | Chang | H01L 33/06 257/13 |
| 2016/0300745 A1* | 10/2016 | Chang | H01L 25/0753 |
| 2018/0190876 A1* | 7/2018 | Liu | H01L 33/62 |
| 2018/0192495 A1* | 7/2018 | Kim | H05B 33/26 |
| 2018/0240937 A1* | 8/2018 | Park | H05K 1/111 |
| 2020/0013662 A1* | 1/2020 | Chaji | H01L 21/6835 |
| 2020/0058838 A1* | 2/2020 | Choi | H01L 27/156 |
| 2020/0083415 A1* | 3/2020 | Kim | H01L 25/167 |
| 2020/0235077 A1* | 7/2020 | Jeon | H01L 51/50 |
| 2021/0091052 A1* | 3/2021 | Schuele | H01L 24/81 |
| 2021/0111148 A1* | 4/2021 | Chen | H01L 24/83 |
| 2022/0149254 A1* | 5/2022 | Schuele | H01L 33/486 |

FOREIGN PATENT DOCUMENTS

| | | |
|---|---|---|
| KR | 10-2016-0087264 A | 7/2016 |
| KR | 10-2017-0096471 A | 8/2017 |
| WO | WO 2017/037475 A1 | 3/2017 |

\* cited by examiner

METHOD FOR MANUFACTURING DISPLAY DEVICE USING SEMICONDUCTOR LIGHT-EMITTING ELEMENTS AND DISPLAY DEVICE

CROSS-REFERENCE TO RELATED APPLICATIONS

This application is the National Stage filing under 35 U.S.C. § 371 of International Application No. PCT/KR2018/001206 filed on Jan. 29, 2018, the entire contents of which are hereby expressly incorporated by reference into the present application.

TECHNICAL FIELD

The present disclosure relates to a method for manufacturing a display device, and more particularly, a method for manufacturing a display device using semiconductor light-emitting elements.

BACKGROUND ART

In recent years, display devices having excellent characteristics such as a thin shape, flexibility, and the like, are being developed in a field of a display technology. On the contrary, currently commercialized main displays are represented by liquid crystal displays (LCDs) and active matrix organic light emitting diodes (AMOLEDs).

However, there exist problems such as not-so-fast response time and difficult implementation of flexibility in case of LCDs, and there exist drawbacks such as short life span and not-so-good yield in case of AMOLEDs.

On the other hand, light emitting diodes (LEDs) are well known light emitting elements for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting elements may be used to implement a flexible display, thereby presenting a scheme for solving the problems.

However, in a case of a display using semiconductor light-emitting elements, an anisotropic conductive film or the like is often used for bonding with a wiring substrate. However, since a transfer of a micro light emitting diode using the related art anisotropic conductive film is performed on an entire area, there are problems in performing various types of transfer, and it is particularly difficult to perform selective transfer for cost reduction.

Various attempts have been made for selective transfer, such as stamp or selective laser ablation, which can adjust an adhesive force. However, due to a nature of the stamp attaching and separating chips, there is a problem that defects occur due to a lack of thermal stability and adhesive force of the stamp during a high-temperature and high-pressure bonding process. Therefore, the present disclosure proposes a manufacturing method capable of maintaining accuracy even in a high-temperature and high-pressure bonding process and a structure implementing the same.

DETAILED DESCRIPTION OF THE DISCLOSURE

Technical Problem

One aspect of the present disclosure is to provide a display device of a new structure capable of enduring a high-temperature and high-pressure bonding process.

Another aspect of the present disclosure is to provide a manufacturing process of a display device having semiconductor light-emitting elements capable of performing a selective transfer and reducing a defect rate.

Technical Solution

To achieve the aspect and other advantages of the present disclosure, there is provided a method for manufacturing a display device according to an embodiment of the present disclosure including a step of transferring semiconductor light-emitting elements to a wiring substrate together with an adhesive layer of a temporary substrate.

More specifically, the manufacturing method of the display device includes steps of: transferring semiconductor light-emitting elements provided on a growth substrate to an adhesive layer of a temporary substrate; curing the adhesive layer of the temporary substrate; aligning the temporary substrate with a wiring substrate having a wiring electrode and a conductive adhesive layer; compressing the temporary substrate to the wiring substrate so that the semiconductor light-emitting elements bond to the wiring substrate together with the adhesive layer of the temporary substrate, and then removing the temporary substrate; and removing at least a part of the adhesive layer to expose the semiconductor light-emitting elements to the outside, and depositing electrodes on the semiconductor light-emitting elements.

In an embodiment, the temporary substrate may include a base portion, and a release layer provided on one surface of the base portion and made of a material separable from the base portion by absorbing laser or ultraviolet light, and wherein the adhesive layer is disposed on one surface of the release layer.

In an embodiment, when removing the temporary substrate from the wiring substrate, the release layer may be separated from the adhesive layer. The manufacturing method may include removing residues of the release layer from a surface of the adhesive layer by etching.

In an embodiment, the adhesive layer may have a thermosetting adhesive that is cured by heat or ultraviolet light.

In addition, the present disclosure presents a display device including a wiring substrate on which a first electrode is disposed, a conductive adhesive layer disposed between the wiring substrate and a second electrode, a plurality of semiconductor light-emitting elements coupled to the conductive adhesive layer and electrically connected to the first electrode and the second electrode, and an upper layer disposed on one surface of the conductive adhesive layer and including a thermosetting adhesive cured by heat or ultraviolet light.

In an embodiment, the thermosetting adhesive may be made of at least one material among epoxy, acrylate and silicone. The thermosetting adhesive may be made of a light-transmitting material. The upper layer may have a through hole in which the second electrode is deposited.

MODES FOR CARRYING OUT PREFERRED EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it will be readily apparent to those skilled in the art that the configuration according to the embodiments described herein may also be applied to a new product type that will be developed later if the device is a device capable of emitting light.

Figure 1:
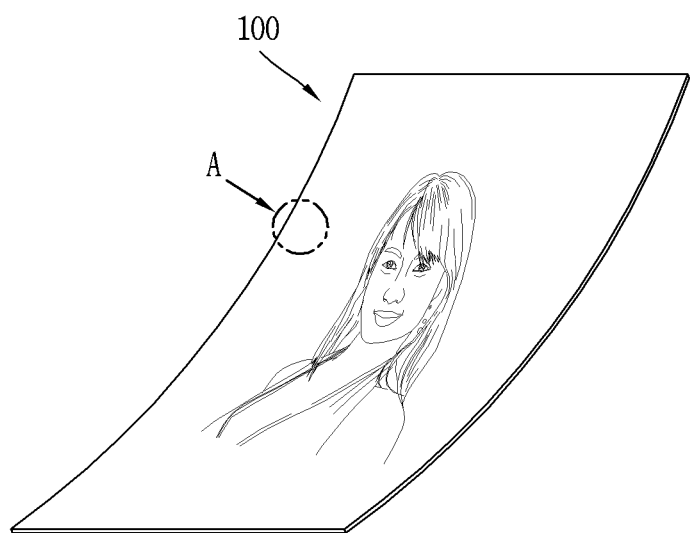
FIG. 1 is a conceptual view illustrating one embodiment of a display device using a semiconductor light-emitting diode according to the present disclosure.

FIG. 1 is a conceptual view illustrating one embodiment of a display device using a semiconductor light-emitting diode according to the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second state may be visual information output on a curved surface. Such visual information is realized by independently controlling an emission of unit pixels (sub-pixels) arranged in a matrix form. The unit pixel denotes an elementary unit for representing one color.

The sub-pixel of the flexible display may be implemented by a semiconductor light-emitting element. The present disclosure exemplarily illustrates a light-emitting diode (LED) as a type of semiconductor light-emitting element for converting current into light. The light-emitting diode may be formed with a small size to perform the role of a sub-pixel even in the second configuration through this.

Hereinafter, a flexible display implemented using the light-emitting diode will be described in more detail with reference to the accompanying drawings.

Figure 2:
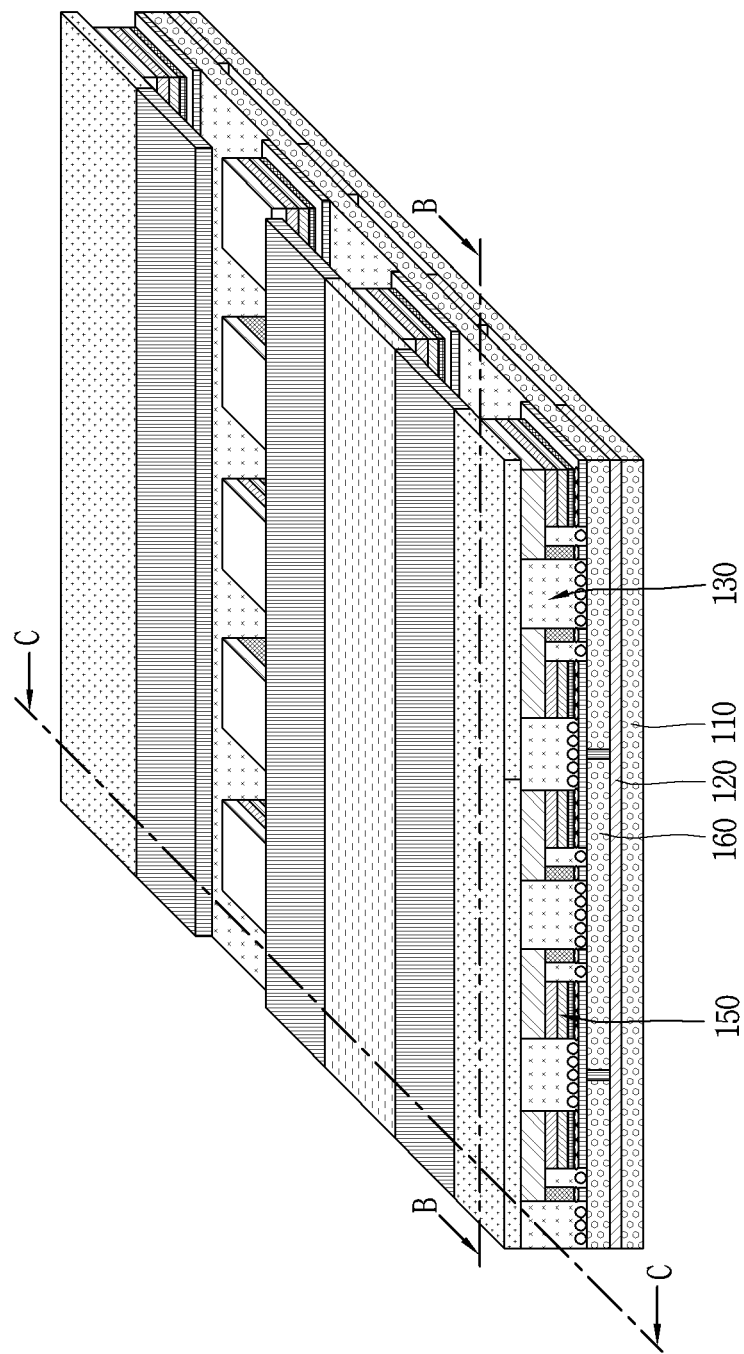
FIG. 2 is a partially enlarged view of part A of FIG. 1, and FIGS. 3A and 3B are sectional views taken along the lines B-B and C-C of FIG. 2.
Figure 3A:
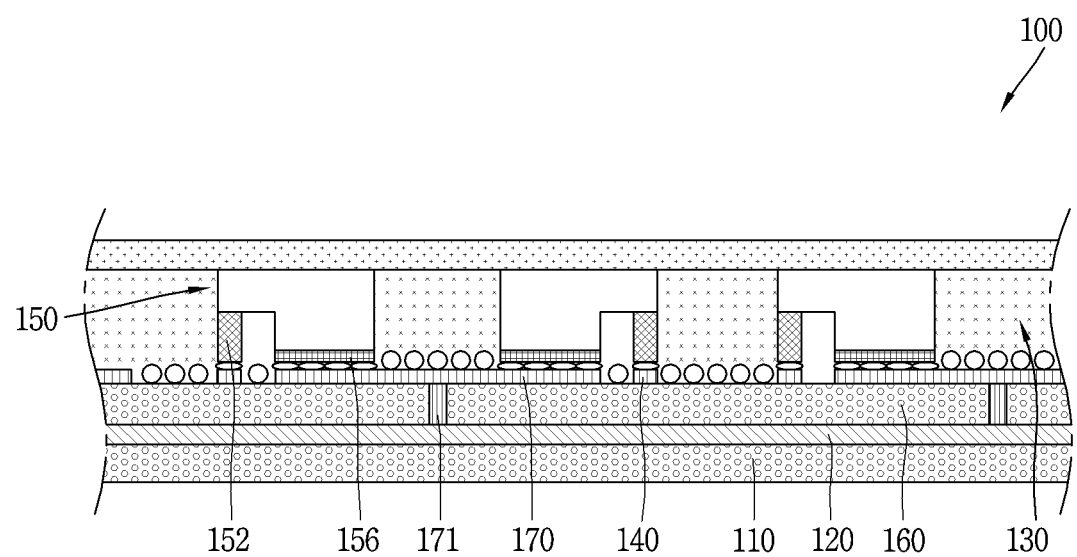
Figure 3B:
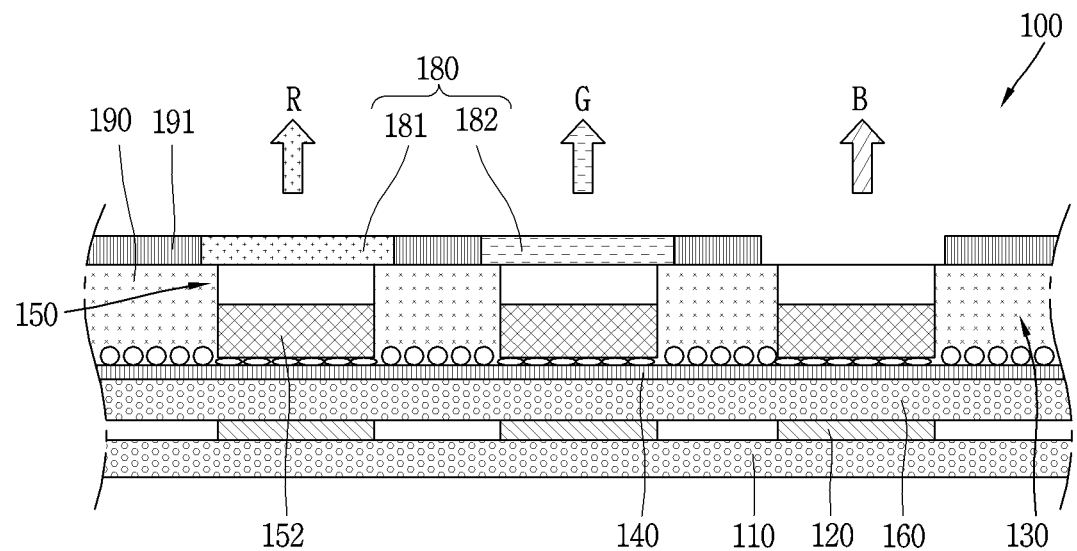
Figure 4:
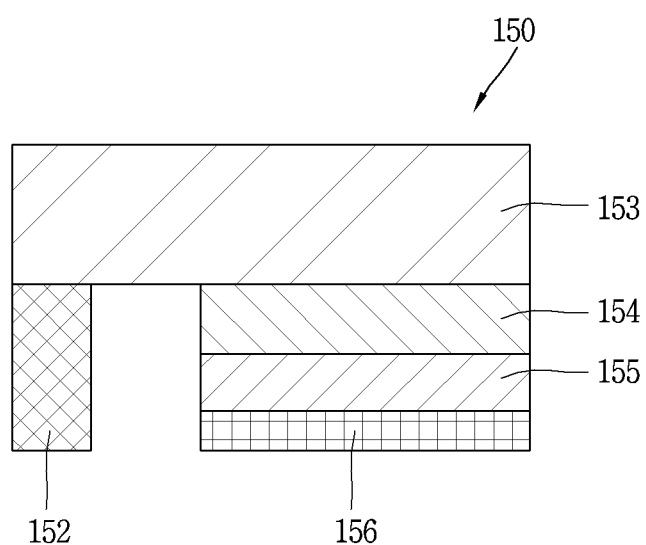
FIG. 4 is a conceptual view illustrating a flip chip type semiconductor light-emitting element of FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting element in FIG. 3A, and FIGS. 5A through 5C are conceptual views illustrating various forms for implementing colors in connection with a flip-chip type semiconductor light-emitting element.

Referring to FIGS. 2, 3A and 3B, there is illustrated a display device 100 using a passive matrix (PM) type semiconductor light-emitting element as a display device 100 using a semiconductor light-emitting element. However, an example described below may also be applicable to an active matrix (AM) type semiconductor light-emitting element.

The display device 100 may include a substrate 110, a first electrode 120, a conductive adhesive layer 130, a second electrode 140, and a plurality of semiconductor light-emitting elements 150.

The substrate 110 may be a flexible substrate. The substrate 110 may contain glass or polyimide (PI) to implement the flexible display device. The substrate 110 may alternatively be made of any material with insulating property and flexibility, for example, polyethylene naphthalate (PEN), polyethylene terephthalate (PET), and the like. Furthermore, the substrate 110 may be either one of transparent and non-transparent materials.

The substrate 110 may be a wiring substrate provided with the first electrode 120, and thus the first electrode 120 may be placed on the substrate 110.

As illustrated, an insulating layer 160 may be disposed on the substrate 110 on which the first electrode 120 is located, and an auxiliary electrode 170 may be disposed on the insulating layer 160. In this case, a configuration in which the insulating layer 160 is deposited on the substrate 110 may be a single wiring substrate. More specifically, the insulating layer 160 may be formed of a flexible insulating material, such as polyimide (PI), PET, or PEN, and may be formed integrally with the substrate 110 to form a single substrate.

The auxiliary electrode 170 is an electrode that electrically connects the first electrode 120 and the semiconductor light-emitting element 150, and is disposed on the insulating layer 160 to correspond to a position of the first electrode 120. For example, the auxiliary electrode 170 may have a dot-like shape and may be electrically connected to the first electrode 120 by an electrode hole 171 formed through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, a layer performing a specific function may be disposed between the insulating layer 160 and the conductive adhesive layer 130, or the conductive adhesive layer 130 may also be disposed on the substrate 110 without the insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film in which an anisotropic conductive medium is mixed with an insulating base member. When heat and pressure are applied, only a specific portion has conductivity by the anisotropic conductive medium. Hereinafter, description will be given of an example that heat and pressure are applied to the anisotropic conductive film, but other methods may alternatively be used to allow the anisotropic conductive film to partially have conductivity. Examples of this method may be a method of applying one of the heat and the pressure, a UV curing method, and the like.

In addition, the anisotropic conductive medium may be, for example, a conductive ball or a conductive particle. According to this embodiment, the anisotropic conductive film is a film in which conductive balls are mixed with an insulating base member. When heat and pressure are applied, only specific portion of the anisotropic conductive film obtains conductivity by the conductive balls. The anisotropic conductive film may be a state of containing a plurality of particles each of which a core of a conductive material is coated with an insulating film made of a polymer material. In this case, the insulating film of a portion to which heat and pressure have been applied is broken and thus obtains the conductivity by the core. At this time, the shape of the core may be deformed to form a layer brought into contact with each other in a thickness direction of the film. As a more specific example, heat and pressure are applied to the entire anisotropic conductive film, and an electric connection in the Z-axis direction is partially formed by a height difference of an object adhered by the anisotropic conductive film.

As another example, the anisotropic conductive film may be a state of containing a plurality of particles each of which the insulating core is coated with the conductive material. In this case, the conductive material in the portion, to which the heat and pressure have been applied, is deformed (stuck, pressed) and thus the portion has the conductivity in the thickness direction of the film. As another example, the conductive material may penetrate through the insulating base member in the Z-axial direction such that the film has the conductivity in its thickness direction. In this case, the conductive material may have a sharp end portion.

The anisotropic conductive film may be a fixed array anisotropic conductive film (ACF) in which conductive balls are inserted into one surface of the insulating base member. More specifically, the insulating base member is formed of a material having adhesiveness, and the conductive balls are concentrated on a bottom portion of the insulating base member. When heat and pressure are applied to the base member, the base member is deformed together with the conductive balls so as to obtain conductivity in a perpendicular direction.

However, the present disclosure is not limited thereto. The anisotropic conductive film may alternatively be formed by randomly inserting conductive balls into the insulating base member, or may be configured in a form of double-ACF in which a plurality of layers is provided and the conductive balls are disposed in one of the layers.

The anisotropic conductive paste is a combination of a paste and conductive balls, namely, may be a paste in which conductive balls are mixed with a base material having insulating property and adhesiveness. In addition, the solution containing conductive particles may be a solution in which conductive particles or nano particles are contained.

Referring again to the drawing, the second electrode 140 is located at the insulating layer 160 with being spaced apart from the auxiliary electrode 170. In other words, the conductive adhesive layer 130 is disposed on the insulating layer 160 where the auxiliary electrode 170 and second electrode 140 are located.

When the conductive adhesive layer 130 is formed in a state that the auxiliary electrode 170 and second electrode 140 are located on the insulating layer 160 and then the semiconductor light-emitting element 150 is connected thereto in a flip chip form with the application of heat and pressure, the semiconductor light-emitting element 150 is electrically connected to the first electrode 120 and second electrode 140.

Referring to FIG. 4, the semiconductor light-emitting element may be a flip chip type light-emitting element.

For example, the semiconductor light-emitting element includes a p-type electrode 156, a p-type semiconductor layer 155 on which the p-type electrode 156 is formed, an active layer 154 disposed on the p-type semiconductor layer 155, an n-type electrode 153 disposed on the active layer 154, and an n-type electrode 152 disposed on the n-type semiconductor layer 153 with being spaced apart from the p-type electrode 156 in a horizontal direction. In this case, the p-type electrode 156 may be electrically connected to the auxiliary electrode 170 and the conductive adhesive layer 130, and the n-type electrode 152 may be electrically connected to the second electrode 140.

Referring back to FIGS. 2 and 3, the auxiliary electrode 170 may be formed long in one direction, and one auxiliary electrode may be electrically connected to the plurality of semiconductor light-emitting elements 150. For example, the p-type electrodes of the left and right semiconductor light-emitting elements based on the auxiliary electrode may be electrically connected to one auxiliary electrode.

More specifically, the semiconductor light-emitting element 150 is press-fitted into the conductive adhesive layer 130 by heat and pressure. Accordingly, only a portion between the p-type electrode 156 and auxiliary electrode 170 of the semiconductor light-emitting element 150 and a portion between the n-type electrode 152 and second electrode 140 of the semiconductor light-emitting element 150 have conductivity, and the remaining portion does not have conductivity since there is no press-fitting of the semiconductor light-emitting element. As described above, the conductive adhesive layer 130 allow the mutual connection as well as an electrical connection between the semiconductor light-emitting element 150 and the auxiliary electrode 170 and between the semiconductor light-emitting element 150 and the second electrode 140.

In addition, the plurality of semiconductor light-emitting elements 150 constitute a light-emitting element array, and a phosphor layer 180 is formed on the light-emitting element array.

The light-emitting element array may include a plurality of semiconductor light-emitting elements having different brightness values. Each of the semiconductor light-emitting elements 150 constitutes a unit pixel and is electrically connected to the first electrode 120. For example, the first electrode 120 may be in plurality. The semiconductor light-emitting elements, for example, may be arranged in several rows, and the semiconductor light-emitting elements in each row may be electrically connected to one of the plurality of first electrodes.

In addition, since the semiconductor light-emitting elements are connected in a form of a flip chip, the semiconductor light-emitting elements grown on a transparent dielectric substrate can be used. The semiconductor light-emitting elements may be, for example, nitride semiconductor light-emitting elements. Since the semiconductor light-emitting element 150 has excellent brightness, it can constitute an individual unit pixel even though it has a small size.

According to the drawing, a partition wall 190 may be formed between the semiconductor light-emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting element 150 is inserted into the anisotropic conductive film.

Furthermore, when the base member of the anisotropic conductive film is black, the partition wall 190 may have reflective characteristics and simultaneously increase contrast even without an additional black insulator.

As another example, a reflective partition wall may be separately provided as the partition wall 190. In this case, the partition wall 190 may include a black or white insulator according to the purpose of the display device. Reflectivity can be enhanced when the partition wall of the white insulator is used, and reflective characteristics can be obtained and simultaneously contrast can increase when the partition wall of the black insulator is used.

The phosphor layer 180 may be located at an outer surface of the semiconductor light-emitting element 150. For example, the semiconductor light-emitting element 150 is a blue semiconductor light-emitting element that emits blue (B) light, and the phosphor layer 180 performs the role of converting the blue (B) light into a color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting element 151 at a location implementing a red sub-pixel, and a green phosphor 182 capable of converting blue light into green (G) light may be deposited on the blue semiconductor light-emitting element 151 at a location implementing a green sub-pixel. Furthermore, only the blue semiconductor light-emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting element 150 may be combined with a quantum dot (QD) instead of the phosphor to implement such as red (R), green (G) and blue (B) sub-pixels.

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green lights may be also applicable thereto.

Figure 5A:
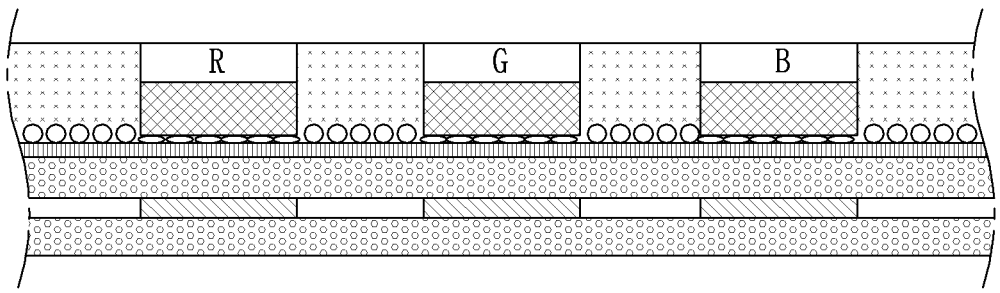
FIGS. 5A to 5C are conceptual views illustrating various forms of realizing a color in relation to a flip chip type semiconductor light-emitting element.

Referring to FIG. 5A, each of the semiconductor light-emitting elements 150 may be implemented as a high-power light-emitting element that emits various light including blue light in a manner that gallium nitride (GaN) is mostly used, and indium (In) and or aluminum (Al) are added thereto.

In this case, the semiconductor light-emitting elements 150 may be red, green and blue semiconductor light-emitting elements, respectively, to implement each sub-pixel. For instance, red, green and blue semiconductor light-emitting elements (R, G, B) are alternately disposed, and red, green and blue sub-pixels implement one pixel by means of the red, green and blue semiconductor light-emitting elements, thereby implementing a full color display.

Figure 5B:
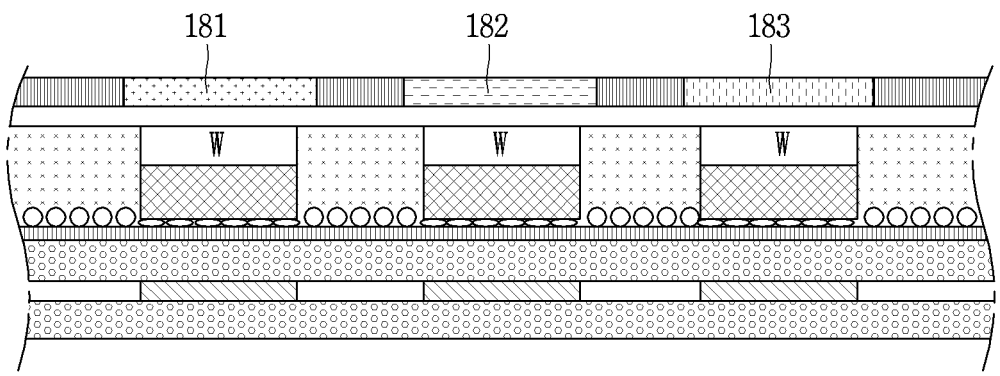

Referring to FIG. 5B, the semiconductor light-emitting element may have a white light-emitting element (W) provided with a yellow phosphor layer for each element. In this case, a red phosphor layer 181, a green phosphor layer 182 and a blue phosphor layer 183 may be provided on the white light-emitting element (W) to implement a sub-pixel. Furthermore, the unit pixel may be formed by using a color filter repeated with red, green and blue on the white light-emitting element (W).

Figure 5C:
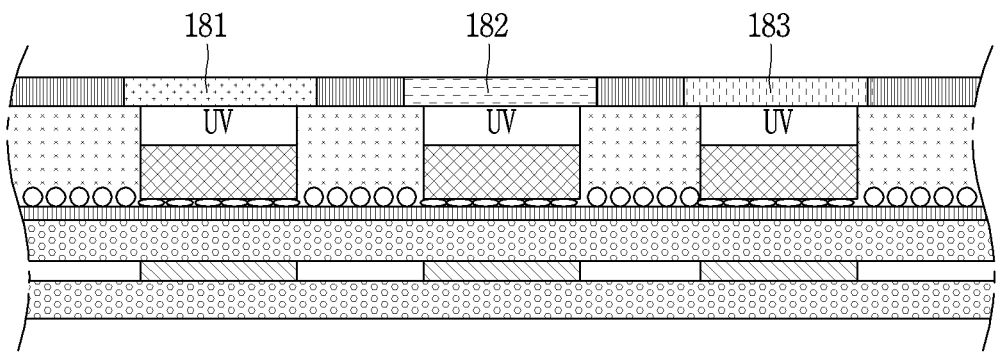

Referring to FIG. 5C, it may also be possible to have a structure in which a red phosphor layer 181, a green phosphor layer 182 and blue phosphor layer 183 are provided on a ultra violet light-emitting element (UV). In this manner, the semiconductor light-emitting element can be used over the entire region up to ultra violet (UV) as well as visible light, and may be extended to a form of semiconductor light-emitting element in which ultra violet (UV) can be used as an excitation source.

Taking this example into consideration again, the semiconductor light-emitting element 150 is placed on the conductive adhesive layer 130 to configure a sub-pixel in the display device. The semiconductor light-emitting element 150 has an excellent luminance characteristic, and thus it may be possible to configure individual sub-pixels even with a small size thereof. The size of the individual semiconductor light-emitting element 150 may be less than 80 μm in the length of one side thereof, and may be a rectangular or square shaped device. In case of a rectangular shaped device, the size thereof may be less than 20×80 μm.

Furthermore, even when a square shaped semiconductor light-emitting element 150 with a length of side of 10 μm is used for a sub-pixel, it will exhibit sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting elements becomes sufficiently large. Accordingly, in this case, it may be possible to implement a flexible display device having an HD image quality.

A display device using the foregoing semiconductor light-emitting element will be fabricated by a new type of fabrication method. Hereinafter, the fabrication method will be described with reference to FIG. 6.

Figure 6:
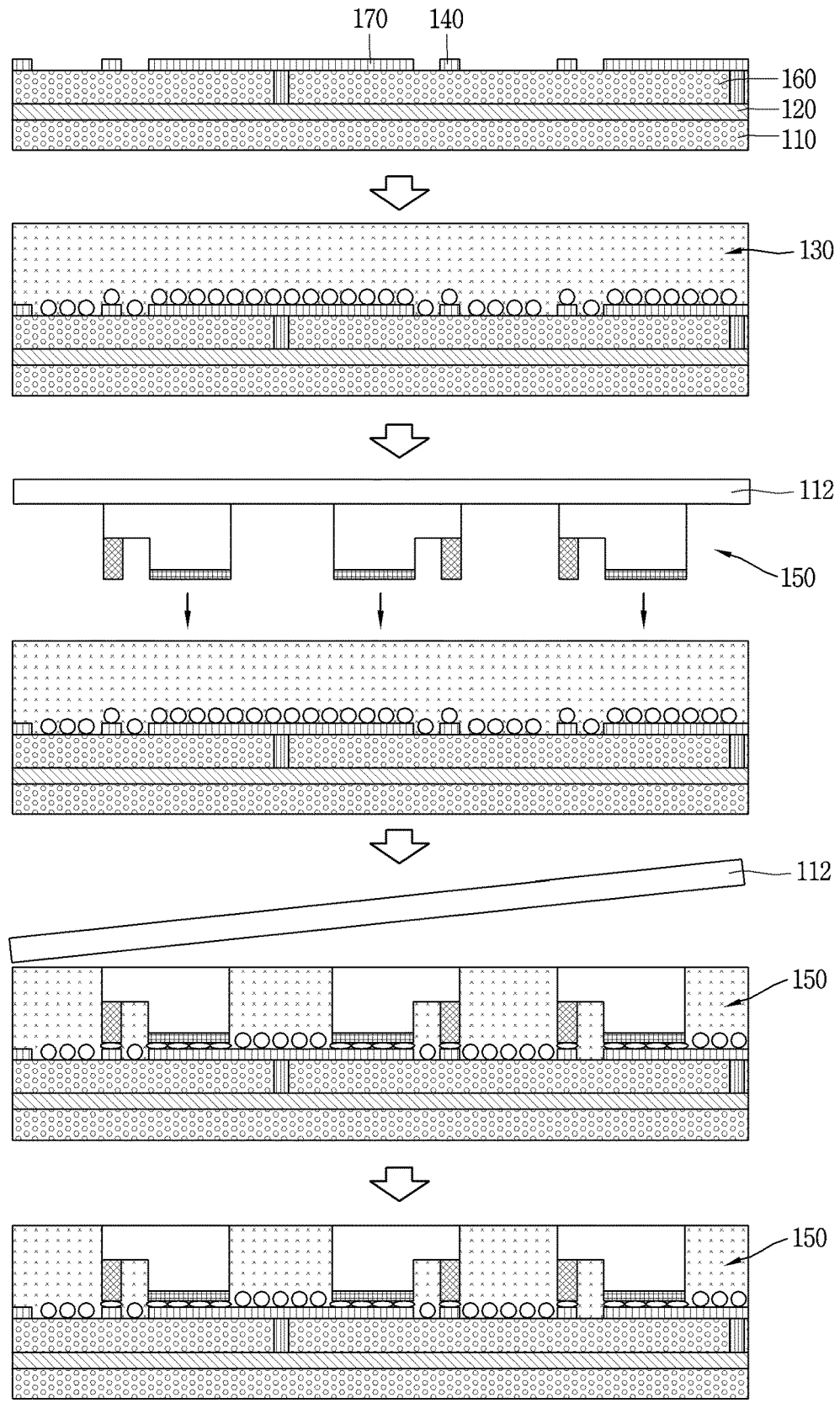
FIG. 6 is a sectional view illustrating a method for manufacturing a display device using a semiconductor light-emitting diode according to the present disclosure.

FIG. 6 is a sectional view illustrating a method for manufacturing a display device using a semiconductor light-emitting diode according to the present disclosure.

Referring to the drawing, first, the conductive adhesive layer 130 is formed on the insulating layer 160 where the auxiliary electrode 170 and second electrode 140 are located. The insulating layer 160 is deposited on the first substrate 110 to form one substrate (or wiring substrate), and the first electrode 120, the auxiliary electrode 170 and the second electrode 140 are disposed at the wiring substrate. In this case, the first electrode 120 and second electrode 140 may be disposed in an orthogonal direction to each other. Furthermore, the first substrate 110 and insulating layer 160 may contain glass or polyimide (PI), respectively, to implement a flexible display device.

The conductive adhesive layer 130 may be implemented by the anisotropic conductive film, for example, and to this end, the anisotropic conductive film may be coated on the substrate where the insulating layer 160 is located.

Next, a second substrate 112 having the plurality of semiconductor light-emitting elements 150 which correspond to the locations of the auxiliary electrodes 170 and second electrodes 140 and constitute individual pixels is disposed such that the semiconductor light-emitting element 150 faces the auxiliary electrode 170 and the second electrode 140.

In this case, the second substrate 112 as a growth substrate for growing the semiconductor light-emitting element 150 may be a sapphire substrate or silicon substrate.

The semiconductor light-emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only portions between the semiconductor light-emitting element 150 and the auxiliary electrode 170 and second electrode 140 may have conductivity due to the characteristics of the anisotropic conductive film having conductivity by thermal compression, thereby allowing the electrodes and semiconductor light-emitting element 150 to be electrically connected to each other. At this time, the semiconductor light-emitting element 150 may be inserted into the anisotropic conductive film, thereby forming a partition wall between the semiconductor light-emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting elements 150 to the outside. Silicon oxide (SiOx) or the like may be coated on the wiring substrate coupled to the semiconductor light-emitting element 150 to form a transparent insulating layer (not shown).

Furthermore, it may further include the process of forming a phosphor layer on one surface of the semiconductor light-emitting element 150. For example, the semiconductor light-emitting element 150 may be a blue semiconductor light-emitting element for emitting blue (B) light, and a red or green phosphor for converting the blue (B) light into the color of the sub-pixel may form a layer on one surface of the blue semiconductor light-emitting element.

The fabrication method or structure of a display device using the foregoing semiconductor light-emitting element may be modified in various forms. For such an example, the foregoing display device may also employ a vertical semiconductor light-emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
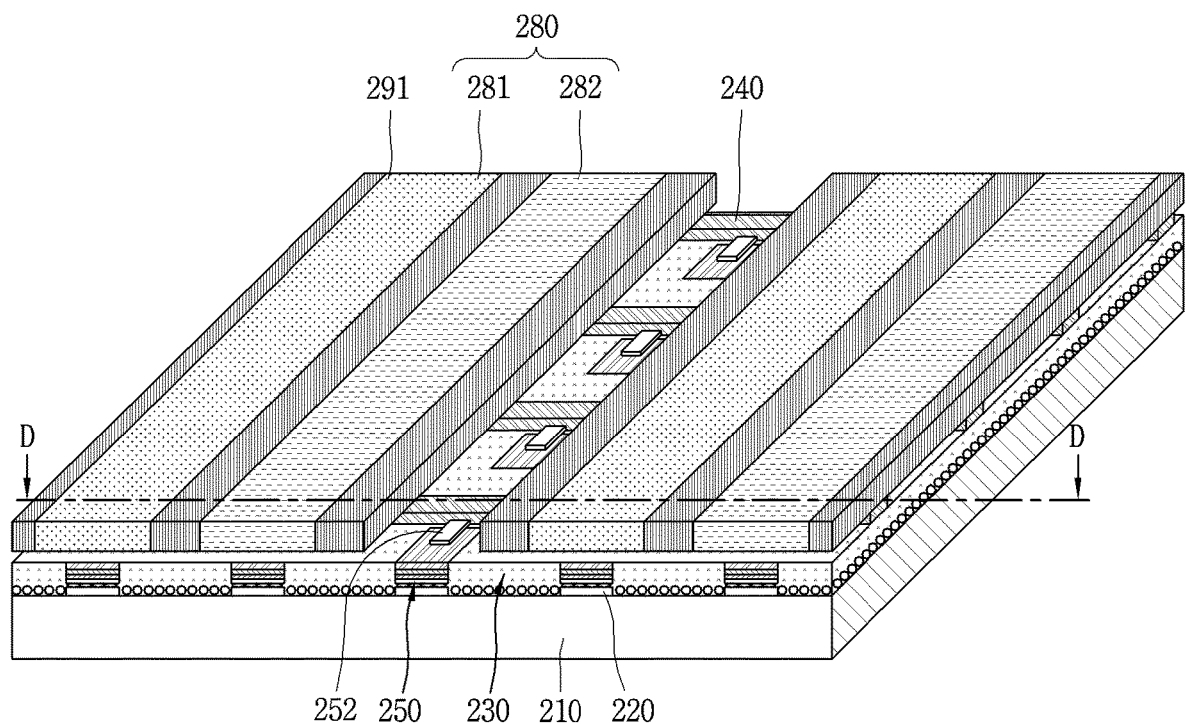
FIG. 7 is a perspective view illustrating another embodiment of a display device using a semiconductor light-emitting diode according to the present disclosure.
Figure 8:
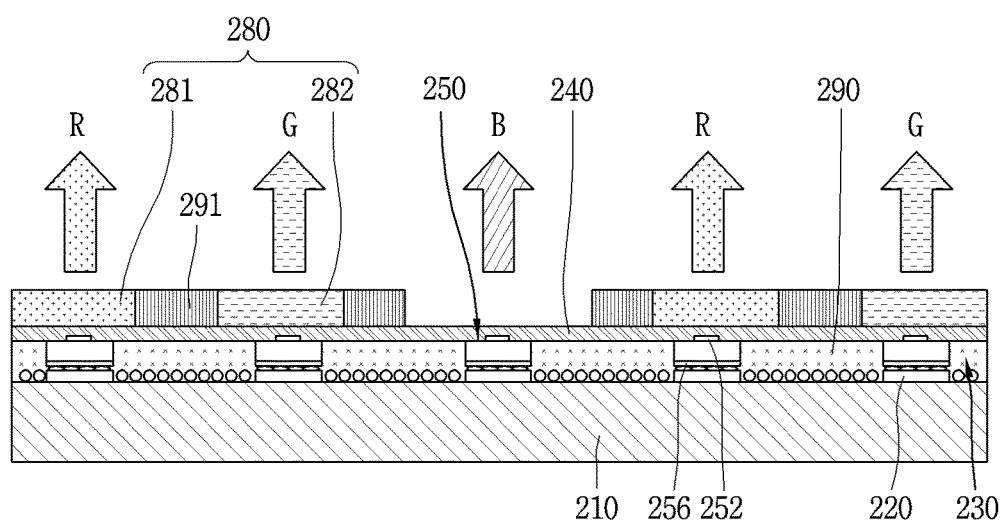
FIG. 8 is a sectional view taken along the line D-D of FIG. 7.
Figure 9:
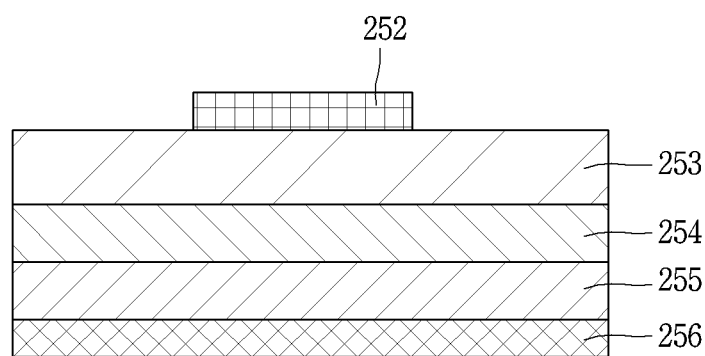
FIG. 9 is a conceptual view illustrating a vertical type semiconductor light-emitting element of FIG. 8.

FIG. 7 is a perspective view illustrating a display device using a semiconductor light-emitting element according to another embodiment of the present disclosure. FIG. 8 is a cross-sectional view taken along line D-D in FIG. 7, and FIG. 9 is a conceptual view illustrating a vertical type semiconductor light-emitting element in FIG. 8.

Referring to these drawings, the display device may be display device using a passive matrix (PM) type of vertical semiconductor light-emitting element.

The display device may include a substrate 210, a first electrode 220, a conductive adhesive layer 230, a second electrode 240 and a plurality of semiconductor light-emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and may be formed in a shape of a long bar in one direction. The first electrode 220 may be formed to perform a role of a data electrode.

The conductive adhesive layer 230 is formed on the substrate 210 where the first electrode 220 is located. Similarly to a display device to which the flip chip type light-emitting element is applied, the conductive adhesive layer 230 may be the anisotropic conductive film (ACF), the anisotropic conductive paste, the solution containing conductive particles, and the like. However, the present embodiment illustrates a case where the conductive adhesive layer 230 is implemented by the anisotropic conductive film.

When the anisotropic conductive film is located in a state that the first electrode 220 is located on the substrate 210, and then heat and pressure are applied to connect the semiconductor light-emitting element 250 thereto, the semiconductor light-emitting element 250 is electrically connected to the first electrode 220. At this time, the semiconductor light-emitting element 250 may be preferably disposed on the first electrode 220.

The electrical connection is generated because the anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting element 250 and the first electrode 220.

In this manner, the semiconductor light-emitting element 250 is placed on the conductive adhesive layer 230, thereby configuring a separate sub-pixel in the display device. Since the semiconductor light-emitting element 250 has excellent brightness, it can constitute an individual unit pixel even though it has a small size. The size of the individual semiconductor light-emitting element 250 may be less than 80 μm in the length of one side thereof, and may be a rectangular or square shaped device. In case of a rectangular shaped device, the size thereof may be less than 20×80 μm.

The semiconductor light-emitting element 250 may be a vertical structure.

A plurality of second electrodes 240 disposed in a direction of crossing a length direction of the first electrode 220, and electrically connected to the vertical semiconductor light-emitting element 250 may be located between vertical semiconductor light-emitting elements.

Referring to FIG. 9, the vertical type semiconductor light-emitting element includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in an upward/downward direction in the vertical semiconductor light-emitting element 250, thereby providing a great advantage capable of reducing the chip size.

Referring again to FIG. 8, a phosphor layer 280 may be formed on one surface of the semiconductor light-emitting element 250. For example, the semiconductor light-emitting element 250 is a blue semiconductor light-emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting element 251 at a location implementing a red sub-pixel, and a green phosphor 282 capable of converting blue light into green (G) light may be deposited on the blue semiconductor light-emitting element 251 at a location implementing a green sub-pixel. Furthermore, only the blue semiconductor light-emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which the flip chip type light-emitting element is applied.

Taking this embodiment into consideration again, the second electrode 240 is located between the semiconductor light-emitting elements 250, and electrically connected to the semiconductor light-emitting elements 250. For example, the semiconductor light-emitting elements 250 may be disposed in a plurality of rows, and the second electrode 240 may be disposed between the rows of the semiconductor light-emitting elements 250.

Since a distance between the semiconductor light-emitting elements 250 constituting individual pixels is sufficiently large, the second electrode 240 may be located between the semiconductor light-emitting elements 250.

The second electrode 240 may be formed as a bar-shaped electrode elongated in one direction, and disposed in a perpendicular direction to the first electrode.

Furthermore, the second electrode 240 may be electrically connected to the semiconductor light-emitting element 250 by a connecting electrode protruded from the second electrode 240. More specifically, the connecting electrode may be an n-type electrode of the semiconductor light-emitting element 250. For example, the n-type electrode is formed as an ohmic electrode for ohmic contact, and the second electrode covers at least part of the ohmic electrode by printing or deposition. Through this, the second electrode 240 may be electrically connected to the n-type electrode of the semiconductor light-emitting element 250.

According to the drawing, the second electrode 240 may be located on the conductive adhesive layer 230. According to circumstances, a transparent insulating layer (not shown) containing silicon oxide (SiOx) may be formed on the substrate 210 provided with the semiconductor light-emitting element 250. When the transparent insulating layer is formed and then the second electrode 240 is placed thereon, the second electrode 240 may be located on the transparent insulating layer. Furthermore, the second electrode 240 may be formed to be spaced apart from the conductive adhesive layer 230 or transparent insulating layer.

If a transparent electrode such as indium tin oxide (ITO) is used to locate the second electrode 240 on the semiconductor light-emitting element 250, the ITO material has a problem of bad adhesiveness with an n-type semiconductor. Accordingly, the second electrode 240 may be placed between the semiconductor light-emitting elements 250, thereby obtaining an advantage in which the transparent electrode is not required. Therefore, an n-type semiconductor layer and a conductive material having good adhesiveness may be used as a horizontal electrode without being restricted by the selection of a transparent material, thereby enhancing the light extraction efficiency.

According to the drawing, a partition wall 290 may be disposed between the semiconductor light-emitting elements 250. In other words, the partition wall 290 may be disposed between the vertical semiconductor light-emitting elements 250 to isolate the semiconductor light-emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting element 250 is inserted into the anisotropic conductive film.

Furthermore, when the base member of the anisotropic conductive film is black, the partition wall 290 may have reflective characteristics and simultaneously increase contrast even without an additional black insulator.

For another example, a reflective partition wall may be separately provided as the partition wall 290. In this case, the partition wall 290 may include a black or white insulator according to the purpose of the display device.

If the second electrode 240 is precisely located on the conductive adhesive layer 230 between the semiconductor light-emitting elements 250, the partition wall 290 may be located between the semiconductor light-emitting element 250 and second electrode 240. Accordingly, individual sub-pixels may be configured even with a small size using the semiconductor light-emitting element 250, and a distance between the semiconductor light-emitting elements 250 may be relatively sufficiently large to place the second electrode 240 between the semiconductor light-emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

In this manner, the semiconductor light-emitting element 250 is placed on the conductive adhesive layer 230, thereby configuring a separate sub-pixel in the display device. Since the semiconductor light-emitting element 250 has excellent brightness, it can constitute an individual unit pixel even though it has a small size. As a result, it may be possible to implement a full color display in which the sub-pixels of red (R), green (G) and blue (B) implement one pixel by means of the semiconductor light-emitting element.

In the display device using semiconductor light-emitting elements of the present disclosure described above, a conductive adhesive layer is used, but there is a problem in that alignment is defective in a high pressure and high temperature bonding process. In addition, in the display device, since semiconductor light-emitting elements grown on a wafer and formed through mesa and isolation are used as individual pixels, selective transfer is needed to manufacture a plurality of displays using a single wafer. The present disclosure proposes a new manufacturing method and structure of a display device capable of solving these problems and satisfying the needs.

To this end, a new manufacturing method of a display device will be described below. FIGS. 10A to 10I are conceptual views illustrating a new process for manufacturing the above-described semiconductor light-emitting elements.

In this specification, a display device 1000 using a passive matrix (PM) type semiconductor light-emitting element is exemplarily illustrated. However, an example described below may also be applicable to an active matrix (AM) type semiconductor light-emitting element.

Figure 10A:
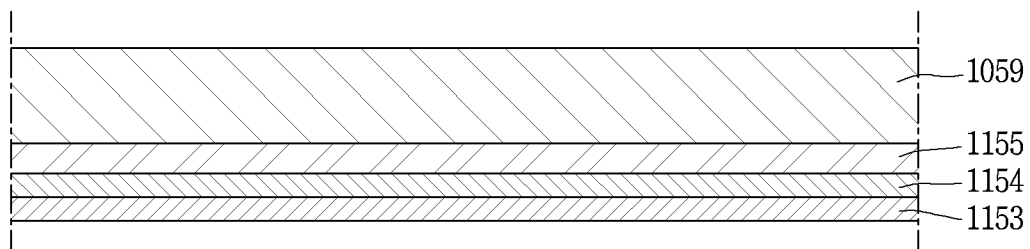
FIGS. 10A to 10I are conceptual views illustrating a new process for manufacturing the above-described semiconductor light-emitting element.

First, according to the manufacturing method, a first conductive semiconductor layer 1153, an active layer 1154, and a second conductive semiconductor layer 1155 are, respectively, grown on a growth substrate 1059 (FIG. 10A).

When the second conductive semiconductor layer 1155 is grown, next, the active layer 1154 is grown on the second conductive semiconductor layer 1155, and then the first conductive semiconductor 1153 is grown on the active layer 1154. In this manner, when the second conductive semiconductor layer 1155, the active layer 1154, and the first conductive semiconductor layer 1153 are sequentially grown, the second conductive semiconductor layer 1155, the active layer 1154 and the first conductive semiconductor layer 1153 form a laminated structure as illustrated in FIG. 10A.

The growth substrate 1059 (wafer) may be formed of a material having optical transparency, for example, one of sapphire ($Al_2O_3$), GaN, ZnO, or AlO, but the present disclosure is not limited thereto. In addition, the growth substrate 1059 may be made of a material suitable for growing a semiconductor material, namely, a carrier wafer. The growth substrate 1059 may also be formed of a material having high thermal conductivity. The growth substrate 1059 may use at least one of a SiC substrate having higher thermal conductivity than the sapphire (Al2O3) substrate, Si, GaAs, GaP, InP and $Ga_2O_3$, in addition to a conductive substrate or an insulating substrate.

Figure 10B:
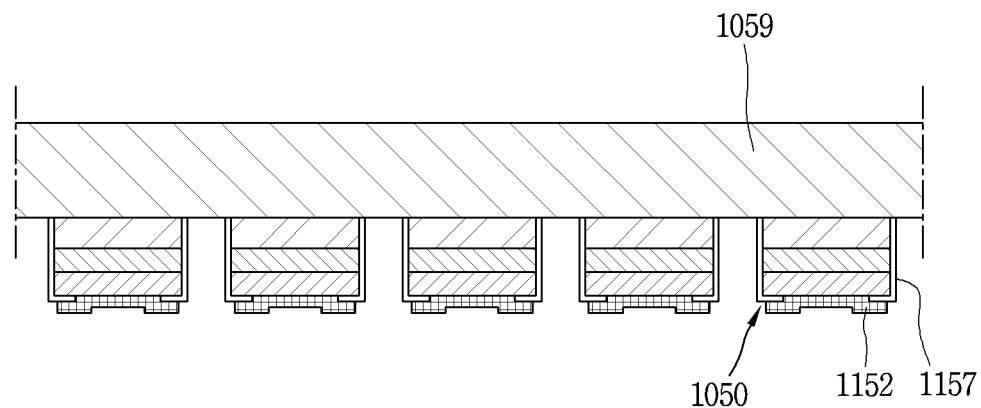

Next, isolation is performed so that a plurality of light-emitting elements forms a light-emitting element array (FIG. 10B).

In this case, at least a part of the second conductive semiconductor layer 1155, the active layer 1154, and the first conductive semiconductor layer 1153 is removed, so that a surface of the growth substrate is exposed to the outside.

Next, a passivation layer 1157 surrounding isolated semiconductor light-emitting elements 1050 is formed, and a first conductive electrode 1152 or an n-type electrode is formed on one surface of the first conductive semiconductor layer. The first conductive electrode 1152 may be formed by a deposition method such as sputtering, but the present disclosure is not limited thereto.

Then, transferring the semiconductor light-emitting elements provided on the growth substrate to the adhesive layer of the temporary substrate is proceeded.

Figure 10C:
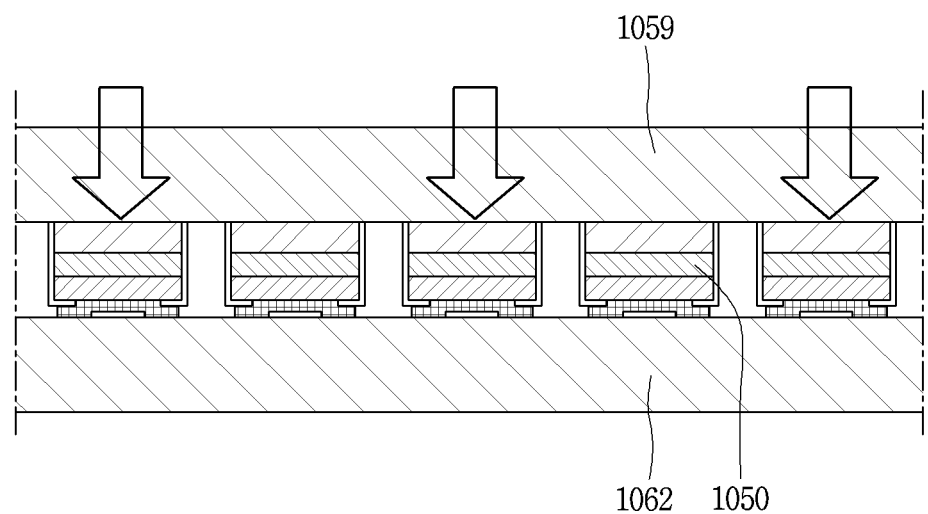

For example, a step of bonding and then separating the growth substrate and a stamping substrate 1062 is performed so that the semiconductor light-emitting elements 1050 move to the stamping substrate 1062 (FIG. 10C).

For example, semiconductor light-emitting elements provided on the growth substrate are selectively stamped on the stamping substrate.

The stamping substrate 1062 may be made of polydimethylsiloxane (PDMS) material. Accordingly, the stamping substrate 1062 may be referred to as a PDMS substrate. As illustrated, due to an adhesive power of the PDMS material, the semiconductor light-emitting elements 1050 disposed on the growth substrate move to the stamping substrate.

Figure 10D:
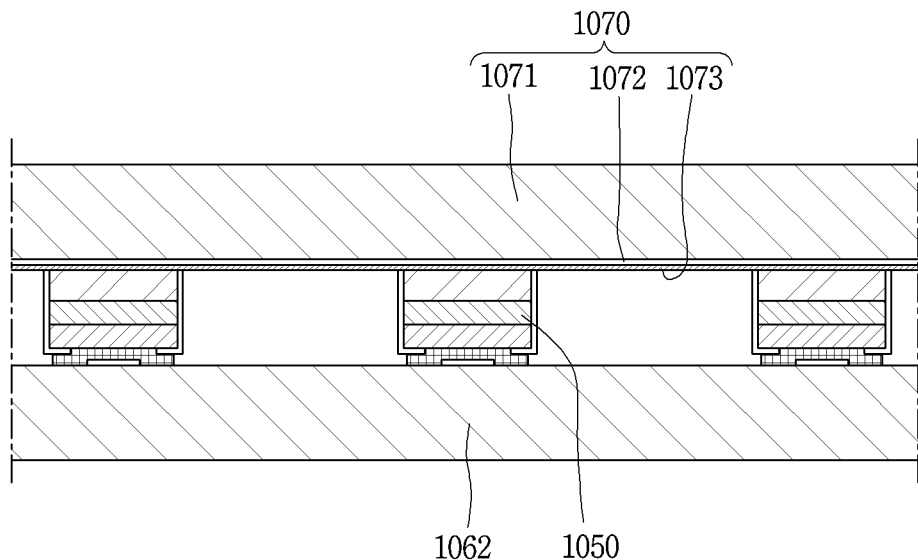

Next, a step of transferring the semiconductor light-emitting elements that are transferred to the stamping substrate to the adhesive layer of the temporary substrate is performed (FIG. 10D).

According to the drawing, a temporary substrate 1070 includes a base portion 1071, a release layer 1072, and an adhesive layer 1073. In addition, the temporary substrate 1070 may be implemented in a liquid type or a film type. The liquid type is implemented by coating (spin coating or bar coating), and the film type is implemented by lamination.

The base portion 1071 is a plate-shaped substrate, and may be made of a material that can transmit laser or ultraviolet light. Meanwhile, the release layer 1072 (separation layer) is provided on one surface of the base portion 1071 and is made of a material separable from the base portion 1071 by absorbing laser or ultraviolet light. In addition, the adhesive layer 1073 may be disposed on one surface of the release layer 1072.

In this case, the adhesive layer 1073 may have a thermosetting adhesive that is cured by heat or ultraviolet light, and the thermosetting adhesive may be made of at least one material among epoxy, acrylate and silicone.

The release layer 1072 is a layer separated from the temporary substrate 1070, then removed by a release process and etching in which laser or ultraviolet light is irradiated. However, the adhesive layer 1073 remains on a surface of a conductive adhesive layer 1030 (see, FIG. 10F) of the display device to form an upper layer.

According to the structure, since functions are divided into the adhesive layer 1073 (high heat-resistant adhesive) and the release layer 1072, unlike the related art stamp, there is no need to control an adhesive force, and a stable yield is possible. In addition, since the release layer 1072 is positioned on an entire surface of the substrate rather than on individual chips, they can be fixed to each other in a simple manner.

Figure 10E:
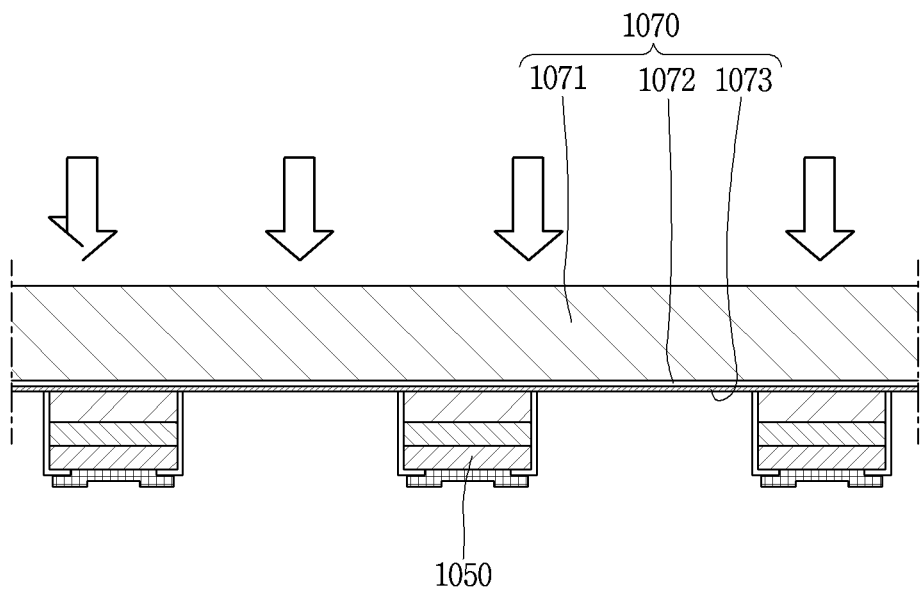
Figure 10F:
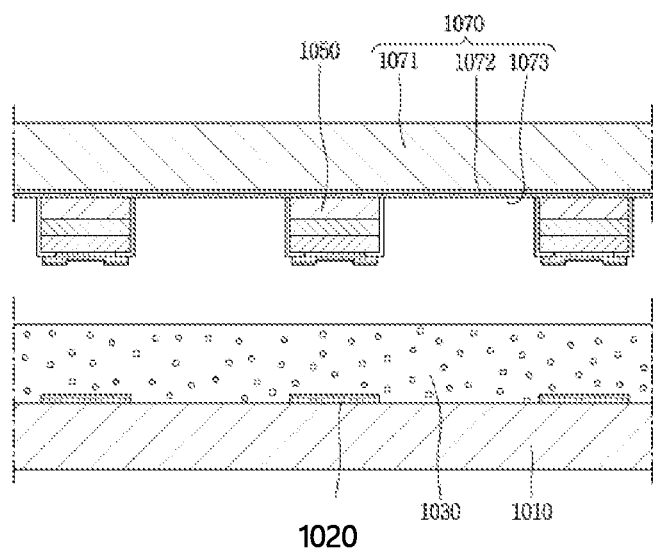
Figure 10G:
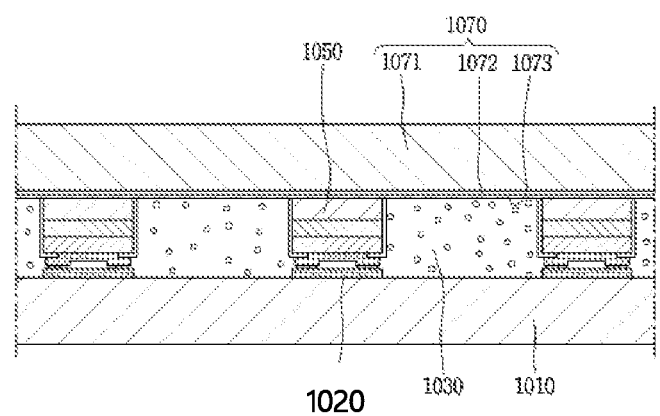
Figure 10H:
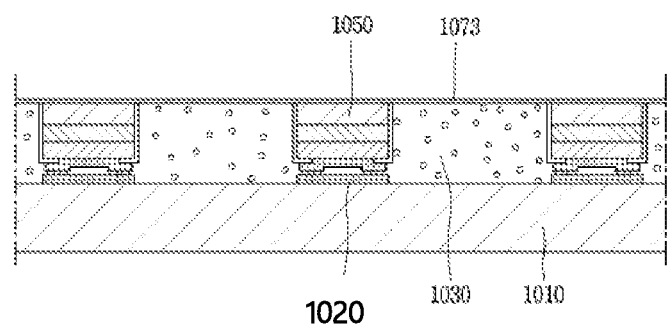
Figure 10I:
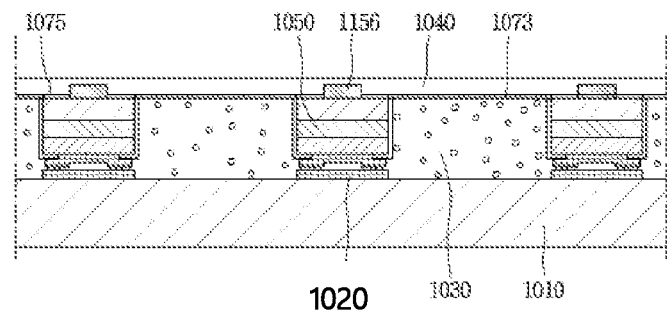

Thereafter, a step of curing the adhesive layer of the temporary substrate is proceeded (FIG. 10E). This is for thermal stability of high heat-resistant adhesive, and in this step, heat or ultraviolet curing is performed. Next, a wiring substrate having a wiring electrode and a conductive adhesive layer is aligned with the temporary substrate (FIG. 10F). Specifically, the semiconductor light-emitting elements 1050 are aligned on pixel positions of the wiring electrode of the wiring substrate 1010. For example, the temporary substrate 1070 on which a plurality of semiconductor light-emitting elements 1050 constituting individual pixels is positioned is disposed such that the semiconductor light-emitting elements 1050 face a first electrode 1020.

Next, a step of pressing the temporary substrate to the wiring substrate 1010 then removing the temporary substrate is performed (FIG. 10G) so that the semiconductor light-emitting element is bonded to the wiring substrate together with the adhesive layer of the temporary substrate. The temporary substrate 1070 can be removed by firstly temporarily bonding the temporary substrate 1070 onto the conductive adhesive layer 1030 and adding heat and pressure thereto, and then applying laser lift-off (LLO) method or chemical lift-off (CLO) method. Alternatively, the semiconductor light-emitting element may be bonded onto the wiring substrate 1010 by firstly removing the temporary substrate 1070 and applying heat or a catalyst while pressing the conductive adhesive layer 1030. In this case, since the adhesive layer 1073 of the temporary substrate 1070 has high thermal stability, the semiconductor light-emitting element can be transferred to the conductive adhesive layer 1030 while being fixed at its position.

In the step of removing the temporary substrate 1070 from the wiring substrate 1010, the release layer 1072 is separated from the adhesive layer 1073. Since the release layer 1072 is a layer separated from the temporary substrate 1070 by a laser, the release layer 1072 may be separated from the substrate in the step of removing the temporary substrate 1070.

Next, a step of removing residues of the release layer from the surface of the adhesive layer by etching (FIG. 10H) is proceeded, then a step of removing at least a part of the adhesive layer, exposing the semiconductor light-emitting element to the outside, and depositing the electrodes to the semiconductor light-emitting element (FIG. 10I) is proceeded. By this process, a through hole 1075 is formed in the adhesive layer 1073, and an upper wiring of the semiconductor light-emitting element may be implemented by the through hole 1075.

According to the manufacturing process described above, in a case of a transfer process requiring high-temperature and high-pressure bonding, such as the anisotropic conductive film, stable transfer is possible by applying a temporary substrate in which a high heat-resistant adhesive and a release layer are combined.

Figure 11:
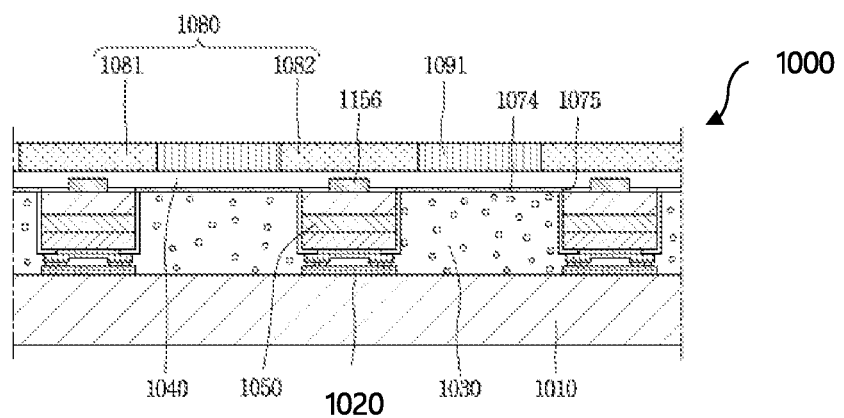
FIGS. 11 and 12 are sectional views illustrating a display device applied to the manufacturing process of FIGS. 10A to 10I.
Figure 12:
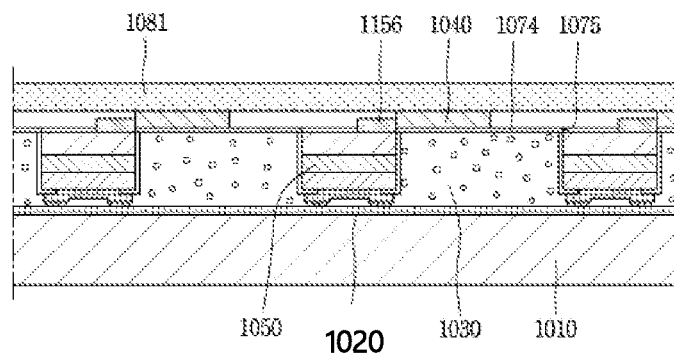

Hereinafter, a structure of the display device implemented by the manufacturing process will be described in more detail. FIGS. 11 and 12 are sectional views illustrating a display device applied to the manufacturing process of FIGS. 10A to 10I, and FIG. 13 is an enlarged view of a semiconductor light-emitting element applied to the display device of FIG. 11.

Figure 13:
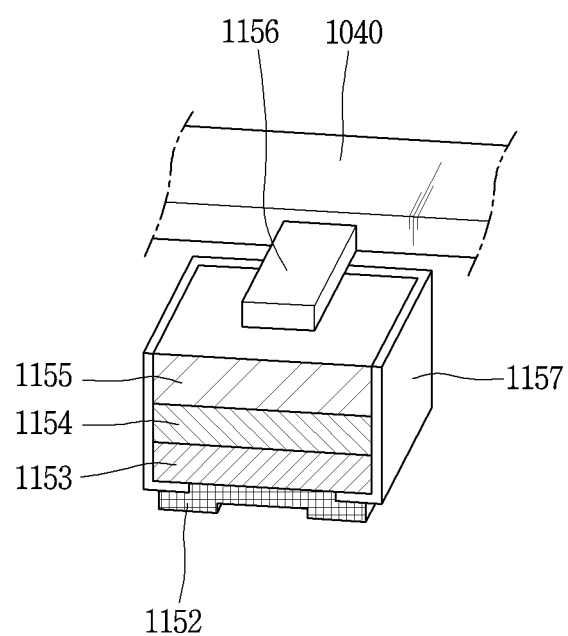
FIG. 13 is an enlarged view of a semiconductor light-emitting element applied to the display device of FIG. 11.

Referring to FIGS. 11, 12 and 13, there is illustrated the display device 1000 using the passive matrix (PM) type semiconductor light-emitting element as a display device 1000 using semiconductor light-emitting elements. However, an example described below may also be applicable to the active matrix (AM) type semiconductor light-emitting element.

The display device 1000 may include the substrate 1010, the first electrode 1020, the conductive adhesive layer 1030, a second electrode 1040, and a plurality of semiconductor light-emitting elements 1050. Here, the first electrode 1020 and the second electrode 1040 may each include a plurality of electrode lines.

The substrate 1010 as a wiring substrate disposed with the first electrode 1020 may include polyimide (PI) to implement a flexible display device. In addition, any one may be used if it is an insulating and flexible material.

As another example, the substrate 1010 may be a rigid substrate to implement a display device that is not flexible. Therefore, the display device of this embodiment may be implemented as a non-flexible display or a signage.

A first wiring 1020 may be located on the substrate 1010, and may be formed in a shape of a long bar in one direction. The first wiring 1020 may be formed to perform the role of the data electrode. In addition, since the first wiring 1020 is disposed under the semiconductor light-emitting element, the first wiring 1020 may be a lower wiring.

The conductive adhesive layer 1030 is formed on the substrate 1010 where the first electrode 1020 is located. Similarly to the above-described display device to which the flip chip type light-emitting element is applied, the conductive adhesive layer 1030 may be the anisotropic conductive film (ACF), the anisotropic conductive paste, the solution containing conductive particles, and the like. However, in this embodiment, the conductive adhesive layer 1030 may be replaced with an adhesive layer. For example, when the first electrode 1020 is not located on the substrate 1010 and is formed integrally with the conductive electrode of the semiconductor light-emitting element, the adhesive layer may not need conductivity.

A plurality of second electrodes 1040 disposed in a direction of crossing the length direction of the first electrode 1020, and electrically connected to the semiconductor light-emitting elements 1050 may be located between semiconductor light-emitting elements.

According to the drawing, the second electrode 1040 may be located on the conductive adhesive layer 1030. That is, the conductive adhesive layer 1030 is disposed between the wiring substrate and the second electrode 1040. The second electrode 1040 may be electrically connected by contact with the semiconductor light-emitting elements 1050.

By the structure described above, a plurality of semiconductor light-emitting elements 1050 is coupled to the conductive adhesive layer 1030, and is electrically connected to the first electrode 1020 and the second electrode 1040.

According to circumstances, a transparent insulating layer (not shown) containing silicon oxide (SiOx) may be formed on the substrate 1010 having the semiconductor light-emitting elements 1050. When the transparent insulating layer is formed and then the second electrode 1040 is placed thereon, the second electrode 1040 may be located on the transparent insulating layer. Furthermore, the second electrodes 1040 may be provided on the conductive adhesive layer 1030 or on the transparent insulating layer with being spaced apart from each other.

As illustrated, the plurality of semiconductor light-emitting elements 1050 may form a plurality of columns in a direction parallel to the plurality of electrode lines provided on the first electrode 1020. However, the present disclosure is not necessarily limited to this example. For example, the plurality of semiconductor light-emitting elements 1050 may form a plurality of columns along the second electrode 1040.

Furthermore, the display device 1000 may further include a phosphor layer 1080 formed on one surface of the plurality of semiconductor light-emitting elements 1050. For example, the semiconductor light-emitting elements 1050 is a blue semiconductor light-emitting element that emits blue (B) light, and the phosphor layer 1080 performs the role of converting the blue (B) light into a color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light-emitting element 1051*b* at a location implementing a red sub-pixel, and a green phosphor 1082 capable of converting blue light into green (G) light may be deposited on the blue semiconductor light-emitting element 1051*b* at a location implementing a green sub-pixel. Furthermore, only the blue semiconductor light-emitting element 1051*c* may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light-emitting elements 1050 may be combined with a quantum dot (QD) instead of the phosphor to implement such as red (R), green (G) and blue (B) sub-pixels.

Meanwhile, in order to improve a contrast of the phosphor layer 1080, the display device may further include a black matrix 1091 disposed between respective phosphors. The black matrix 1091 may form a gap between phosphor dots, and a black material may fill the gap. Accordingly, the black matrix 1091 can absorb external light reflection, and at the same time, enhance the contrast of luminance. Such a black matrix 1091 is positioned between the respective phosphor layers along the first electrode 1020 in a direction in which the phosphor layers 1080 are stacked. In this case, the phosphor layer is not provided at a position corresponding to the blue semiconductor light-emitting element 1051, but the black matrix 1091 may be provided at both sides of a space not having the phosphor layer (or disposed with being separated by the blue semiconductor light-emitting element 1051*c*).

Again, regarding the semiconductor light-emitting elements 1050 according to this embodiment, electrodes are disposed in the upward/downward direction, thereby providing a great advantage capable of reducing a size of the chip. However, although the electrodes are disposed in the upward/downward direction, the semiconductor light-emitting element may be the flip chip type.

According to the drawing, the semiconductor light-emitting element 1050 may be either a green semiconductor light-emitting element or the blue semiconductor light-emitting element.

In this case, structures of the green semiconductor light-emitting element and the blue semiconductor light-emitting element are identical, and this will be described firstly with reference to FIG. 14.

The semiconductor light-emitting element 1050 may be implemented as a high-power light-emitting element that emits blue light or green light in a manner that gallium nitride (GaN) is mostly used, and indium (In) and/or aluminum (Al) are added thereto. For example, the plurality of semiconductor light-emitting elements 1050 may be a gallium nitride thin film formed of various layers such as n-Gan, p-Gan, AlGaN, and InGan.

In addition, the semiconductor light-emitting element may be a micro light-emitting diode chip. Here, the micro light-emitting diode chip may have a cross-sectional area smaller than a size of the light-emitting region in the sub-pixel, and as an example, may have a scale of 1 to 100 micrometers.

Referring to FIG. 13, the semiconductor light-emitting element 1050, for example, is a vertical type and includes the first conductive electrode 1152, the first conductive semiconductor layer 1153 on which the first conductive electrode 1152 is disposed, the active layer 1154 disposed on the first conductive semiconductor layer 1153, the second conductive semiconductor layer 1155 disposed on the active layer 1154, and a second conductive electrode 1156 disposed on the second conductive semiconductor layer 1155.

The first conductive semiconductor layer 1153 and the second conductive semiconductor layer 1155 overlap each other. The second conductive electrode 1156 is disposed on an upper surface of the second conductive semiconductor layer 1155, and the first conductive electrode 1152 is disposed on a lower surface of the first conductive semiconductor layer 1153. In this case, the upper surface of the second conductive semiconductor layer 1155 may be one surface of the second conductive semiconductor layer 1155 farthest from the first conductive semiconductor layer 1153, and the lower surface of the first conductive semiconductor layer 1153 may be one surface of the first conductive semiconductor layer 1153 farthest from the second conductive semiconductor layer 1155. As described above, the second conductive electrode 1156 and the first conductive electrode 1152 are disposed up and down having the second conductive semiconductor layer 1155 and the first conductive semiconductor layer 1153 therebetween.

In addition, the passivation layer 1157 is provided on an outermost side of the semiconductor light-emitting element 1050, and accordingly, stabilization characteristics of the semiconductor light-emitting element 1050 can be improved. The passivation layer 1157 may surround the first conductive semiconductor layer 1153, the active layer 1154, and the second conductive semiconductor layer 1155 of the semiconductor light-emitting element 1050.

Referring to FIG. 13 together with FIGS. 11 and 12, the lower surface of the first conductive semiconductor layer 1153 may be a surface closest to the wiring substrate, and the upper surface of the second conductive semiconductor layer may be a surface farthest from the wiring substrate.

More specifically, the first conductive electrode 1152 and the first conductive semiconductor layer 1153 may be a p-type electrode and a p-type semiconductor layer, respectively. The second conductive electrode 1156 and the second conductive semiconductor layer 1155 may be an n-type electrode and an n-type semiconductor layer, respectively. However, the present disclosure is not necessarily limited thereto, and may employ an example in which the first conductive electrode is the n-type and the second conductive electrode is the p-type. The p-type semiconductor layer may be P-type GaN, and the n-type semiconductor layer may be N-type GaN. According to another embodiment of the present disclosure, impurities may be implanted into an intrinsic or doped semiconductor substrate to form the first and conductive semiconductor layers. In addition, a region where a p-n junction is formed by the impurity implantation may serve as the active layer.

In this case, the p-type electrode located at the bottom may be electrically connected to the first electrode 1020 by the conductive adhesive layer, and the n-type electrode located on the top may be electrically connected to the second electrode 1040. Here, the p-type electrode may include a plurality of metal layers made of different metals. For example, a plurality of metal layers made of Ti, Pt, Au, Ti, Cr, etc. may be stacked to form the p-type electrode.

Referring to FIGS. 11 and 12 again, an upper layer 1074 is disposed on one surface of the conductive adhesive layer 1030. The upper layer 1074 may be implemented by transferring the adhesive layer 1073 of the temporary substrate 1070 to the substrate in the above-described manufacturing method with reference to FIGS. 10A to 10I. Therefore, the upper layer 1074 is provided with a thermosetting adhesive that is cured by heat or ultraviolet light. The thermosetting adhesive may be made of at least one material among epoxy, acrylate and silicone.

According to this structure, the above-described phosphor layer 1080 is stacked on an upper surface of the upper layer 1074. Further, in order to transmit light, in this case, the thermosetting adhesive may be made of a light transmissive material.

According to the drawing, the upper layer 1074 may have through holes 1075 in which the second conductive electrode is deposited. Therefore, each of the through holes 1075 may be formed for each semiconductor light-emitting element. The through holes 1075 may be implemented by removing the release layer by etching in the above-described manufacturing method with reference to FIGS. 10A to 10I, and then etching only a corresponding portion for electrode deposition.

In addition, in this case, the second electrode 1040 may be electrically connected by contact with the second conductive electrode 1156 of the semiconductor light-emitting element 1050. The second electrode 1040 connected to the second conductive electrode may be positioned on the upper layer 1074. More specifically, the second electrode 1040, which is an upper wiring, is disposed on one surface of the upper layer 1074. Chips are protected from an external environment by the upper layer 1074, and further, light extraction efficiency may be improved.

According to the structure described above, a display device of a new structure capable of enduring a high-temperature and high-pressure bonding process can be implemented.

According to the present disclosure having the above structure, in a display device in which individual pixels are formed of semiconductor light-emitting elements, the semiconductor light-emitting elements of the growth substrate can be selectively transferred to the wiring substrate.

Particularly, in a case of a transfer process requiring high-temperature and high-pressure bonding, such as the anisotropic conductive film, stable transfer is possible by applying a temporary substrate in which a high heat-resistant adhesive and a release layer are combined. In this case, as the substrate on which the selective transfer is completed is used for transfer again, multiple transfers are possible on one wafer, thereby reducing manufacturing cost.

The aforementioned manufacturing method of display device using the semiconductor light-emitting element are not limited to the configuration and the method of the embodiments described above, but the embodiments may be configured such that all or some of the embodiments are selectively combined so that various modifications can be made.

The invention claimed is:

1. A method for manufacturing a display device, the method comprising:
    transferring semiconductor light-emitting elements provided on a growth substrate to an adhesive layer of a temporary substrate;
    curing the adhesive layer of the temporary substrate to secure the semiconductor light-emitting elements on the adhesive layer;
    aligning the temporary substrate with a wiring substrate, the wiring substrate having a wiring electrode and a conductive adhesive layer;
    compressing the temporary substrate to the wiring substrate so that the semiconductor light-emitting elements bond to the wiring substrate together with the adhesive layer of the temporary substrate, and then removing the temporary substrate; and
    removing at least a part of the adhesive layer to expose the semiconductor light-emitting elements to the outside, and depositing electrodes on the semiconductor light-emitting elements.

2. The method of claim 1, wherein the temporary substrate comprises:
    a base portion;
    a release layer provided on one surface of the base portion and made of a material separable from the base portion by absorbing laser or ultraviolet light; and
    the adhesive layer disposed on one surface of the release layer.

3. The method of claim 2, wherein when removing the temporary substrate from the wiring substrate, the release layer is separated from the adhesive layer.

4. The method of claim 3, further comprising:
    removing residues of the release layer from a surface of the adhesive layer by etching.

5. The method of claim 1, wherein the transferring includes:
    selectively stamping the semiconductor light-emitting elements provided on the growth substrate onto a stamping substrate; and
    transferring the semiconductor light-emitting elements provided on the stamping substrate to the adhesive layer of the temporary substrate.

6. The method of claim 1, wherein the adhesive layer has a thermosetting adhesive that is cured by heat or ultraviolet light.

7. The method of claim 1, wherein the adhesive layer is formed on an entire surface of the temporary substrate.

8. A display device comprising:
    a wiring substrate on which a first electrode is disposed;
    a conductive adhesive layer disposed between the wiring substrate and a second electrode;

a plurality of semiconductor light-emitting elements coupled to the conductive adhesive layer and electrically connected to the first electrode and the second electrode; and an upper layer disposed on one surface of the conductive adhesive layer and including a thermosetting adhesive cured by heat or ultraviolet light.

9. The display device of claim 8, wherein the thermosetting adhesive is made of at least one material among epoxy, acrylate and silicone.

10. The display device of claim 8, wherein the thermosetting adhesive is made of a light-transmitting material.

11. The display device of claim 8, wherein each of the plurality of semiconductor light-emitting elements includes a conductive electrode, and wherein the upper layer has through holes in which the conductive electrode of each semiconductor light-emitting element is respectively deposited.

12. The display device of claim 8, wherein the upper layer is in contact with the plurality of semiconductor light-emitting elements.

13. A method for manufacturing a display device, the method comprising:

transferring semiconductor light-emitting elements to an adhesive layer of a temporary substrate;

aligning the temporary substrate with a wiring substrate, the wiring substrate having a wiring electrode and a conductive adhesive layer;

compressing the temporary substrate to the wiring substrate so that the semiconductor light-emitting elements are attached to the wiring substrate at the wiring electrode while the adhesive layer of the temporary substrate is attached to the semiconductor light emitting elements, and then removing the temporary substrate while maintaining the adhesive layer on the semiconductor light emitting elements; and forming holes in the adhesive layer to respectively correspond to the semiconductor light-emitting elements, and depositing electrodes on the semiconductor light-emitting elements.

14. The method of claim 13, further comprising curing the adhesive layer of the temporary substrate to secure the semiconductor light-emitting elements on the adhesive layer prior to the aligning.

15. The method of claim 14, wherein the temporary substrate comprises:

a base portion;

a release layer provided on one surface of the base portion and made of a material separable from the base portion by absorbing laser or ultraviolet light; and the adhesive layer disposed on one surface of the release layer.

16. The method of claim 13, wherein when removing the temporary substrate from the wiring substrate, the release layer is separated from the adhesive layer and removed with the temporary substrate.

17. The method of claim 13, wherein the temporary substrate is transparent.

18. The method of claim 13, wherein the adhesive layer has a thermosetting adhesive that is cured by heat or ultraviolet light.

19. The method of claim 13, wherein the adhesive layer is in contact with the plurality of semiconductor light-emitting elements after the removing of the temporary substrate.

20. The method of claim 13, wherein the adhesive layer is formed on an entire surface of the temporary substrate.

* * * * *